(12) United States Patent
Heil et al.

(10) Patent No.: US 8,643,280 B2
(45) Date of Patent: Feb. 4, 2014

(54) METHOD FOR CONTROLLING ION ENERGY IN RADIO FREQUENCY PLASMAS

(75) Inventors: Brian George Heil, Wiesbaden (DE); Uwe Czarnetzki, Bochum (DE); Ralf Peter Brinkmann, Erkrath (DE); Thomas Mussenbrock, Wuppertal (DE)

(73) Assignee: Ruhr-Universität Bochum, Bochum (DE)

(*) Notice: Subject to any disclaimer, the term of this patent is extended or adjusted under 35 U.S.C. 154(b) by 586 days.

(21) Appl. No.: 12/864,123

(22) PCT Filed: Jul. 11, 2008
(Under 37 CFR 1.47)

(86) PCT No.: PCT/EP2008/059133
§ 371 (c)(1),
(2), (4) Date: Dec. 20, 2010

(87) PCT Pub. No.: WO2009/115135
PCT Pub. Date: Sep. 24, 2009

(65) Prior Publication Data
US 2011/0248634 A1 Oct. 13, 2011

Related U.S. Application Data

(60) Provisional application No. 61/038,263, filed on Mar. 20, 2008.

(51) Int. Cl.
*H01J 7/24* (2006.01)
*H05B 31/26* (2006.01)
*H01J 13/48* (2006.01)
*H01J 15/04* (2006.01)
*H01J 17/36* (2006.01)
*H05B 37/00* (2006.01)
*H05B 39/00* (2006.01)
*H05B 41/00* (2006.01)

(52) U.S. Cl.
USPC ............... 315/111.21; 315/351; 216/67

(58) Field of Classification Search
USPC ........................................... 315/351
See application file for complete search history.

(56) References Cited

U.S. PATENT DOCUMENTS 5,325,019 A * 6/1994 Miller et al. ............ 315/111.21
6,351,683 B1 * 2/2002 Johnson et al. ............... 700/121
(Continued)

FOREIGN PATENT DOCUMENTS

WO WO99/14699 A 3/1999

OTHER PUBLICATIONS

Schulze J et al: "Space and phase resolved plasma parameters in an industrial dual-frequency capacitively coupled radio-frequency discharge; Space and phase resolved plasma parameters in dual-frequency CCRF discharge" Journal of Physics D. Applied Physics, IOP Publishing, Bristol, GB, vol. 40, No. 22, Nov. 21, 2007, pp. 7008-7018, XP020126757ISSN: 0022-3727.

(Continued)

*Primary Examiner* — Douglas W Owens
*Assistant Examiner* — Dedei K Hammond (57) ABSTRACT

A method of establishing a DC bias in front of at least one electrode in a plasma operating apparatus by applying an RF voltage with at least two harmonic frequency components with a controlled relative phase between the components, where at least one of the higher frequency components is established as an even multiple of the lower frequency component.

2 Claims, 9 Drawing Sheets

(56) References Cited

U.S. PATENT DOCUMENTS

| | | | |
|---|---|---|---|
| 6,829,279 B1* | 12/2004 | Ohmi et al. | 372/50.1 |
| 2003/0079983 A1* | 5/2003 | Long et al. | 204/164 |
| 2003/0164142 A1* | 9/2003 | Koshimizu | 118/409 |
| 2004/0000875 A1 | 1/2004 | Vahedi | |
| 2006/0113037 A1 | 6/2006 | Nishio | |
| 2007/0023398 A1* | 2/2007 | Kobayashi et al. | 219/69.12 |
| 2007/0221331 A1* | 9/2007 | Lee | 156/345.38 |

OTHER PUBLICATIONS

Boyle P C et al: "Independent control of ion current and ion impact energy onto electrodes in dual frequency plasma devices; Control of ion current and ion impact energy" Journal of Physics D. Applied Physics, IOP Publishing, Bristol, GB, vol. 37, No. 5; Mar. 7, 2004, pp. 697-701, XP020015888 ISSN: 0022-3727.

* cited by examiner

METHOD FOR CONTROLLING ION ENERGY IN RADIO FREQUENCY PLASMAS

CROSS REFERENCE

This application claims the benefit and priority of U.S. Provisional Application No. 61/038,263, which was filed on Mar. 20, 2008. U.S. Provisional Application No. 61/038,263 is incorporated herein by reference.

TECHNICAL FIELD

The present invention relates to the field of modification of surfaces and materials by exposure to low pressure plasmas and gases.

BACKGROUND AND RELATED ART

It is well known in the art that the flux and energy of ions is important in determining how a plasma treatment will affect a workpiece. There exist several different methods of adjusting the ion energy during plasma treatment, none of which are generally applicable.

Coburn and Kay, J. Appl. Phys. 43(12):4965-4971 (1972) (cited as Coburn) describes a geometrically based Direct Current (DC) offset effect that depends upon a Radio Frequency (RF) voltage being applied across electrodes immersed in a plasma which have different surface areas. The method of Coburn is commonly used in the semiconductor industry for the manufacture of integrated circuits, and is implemented by placing a silicon wafer upon an electrode immersed in a plasma. Typically, the wall of the vacuum chamber functions as a second electrode and has a significantly larger surface area than the electrode with the wafer. This causes an increase in the average energy of ions striking the silicon wafer. This technique is not applicable when the workpiece has a very large surface area, because the vacuum chamber would be prohibitively large. An example would be a photovoltaic module manufactured using thin films. These modules typically have a surface area greater than a square meter.

There have also been methods developed where multiple RF voltages are applied to one or more electrodes. Boyle, Ellingboe, and Turner, J. Phy. D: Appl. Phys 37:697-701 (2004) (cited as Boyle) describes how a low frequency is used to modulate the ion energy, and a large frequency is used to control plasma production. The abstract of Boyle states that: "In such discharges, a low frequency component couples predominantly to the ions, while a high frequency component couples predominantly to electrons. Thus, the low frequency component controls the ion energy, while the high frequency component controls the plasma density. Clearly this desired behavior is not achieved for arbitrary configurations of the discharge, and in general one expects some unwanted coupling of ion flux and energy."

The method described in Boyle is commonly used in the semiconductor industry, and has been only partially successful in allowing the independent control of ion flux and energy. The method described in Boyle is also difficult to apply to large workpieces due to standing wave effects caused by the high frequency RF voltage.

SUMMARY OF THE INVENTION

The embodiment of the invention provides a method of electrically inducing an asymmetry in the electric fields of sheaths of electrodes exposed to a plasma. This induced asymmetry allows the energy and flux of ions striking a surface to be independently controlled. Embodiments of the present invention solve the technical shortcomings of the prior art. Embodiments of the present invention can be used for plasma treating substrates with arbitrarily large surface areas and there is a clear methodology for adjusting the ion energy.

The ion energy and flux can be independently controlled by applying one or more RF voltages across the discharge. The difference between embodiments of the present invention and the prior art is that two or more harmonic components of the applied RF voltage are even harmonics of each other, and that they have a controlled relative phase. The Appendix provides more background information and a description of additional benefits of the invention. The Appendix provides examples of how the DC bias, and hence the ion energy, is adjusted by controlling the relative phase of the harmonic components of the applied RF voltage.

Embodiments of the invention relate to a method for causing an asymmetry in the electric fields of the plasma sheath region. The average electric field in the sheath region affects the energy that ions have when they strike a workpiece. As a result, this asymmetry in the sheath allows the independnet control of the ion flux and the ion energy received by a workpiece during plasma treatment. Embodiments of the invention work by placing a RF voltage across the discharge. The RF voltage is comprised of at least two harmonic componets that are even harmoics of each other and that have a controlled relative phase.

The present invention provides a method of establishing a DC bias in front of at least one electrode in a plasma operating apparatus by applying a RF voltage as is described in independent claim 1. Embodiments are described in dependent claims 2 through 27. As a note, to conduct a RF current through the plasma, it is obvious that two or more electrodes are needed for the conduction path. However, in the art it is typical to speak of adding a single electrode to the discharge. In this case, it is understood that the second electrode is a part of the vacuum chamber wall or another surface such as part of the vacuum pump that functions as an electrode. This method of establishing a DC bias has the advantage that, the flux of ions and the energy of these ions to a workpiece or substrate exposed to the plasma can be controlled independently. Current methods do not allow for such independent control of these two plasma treatment parameters, and this method works in situations where current methods do not. In particular it allows the control of the ion flux and ion energy for workpieces with a large surface area.

In another respect, the DC bias in front of an electrode with a workpiece can be dynamically controlled. This would be accomplished by varying the amplitudes of the harmonic components that make up the applied RF voltage as a function of time and by varying the relative phase between these components as a function of time. This has the advantage that plasma processes could be adjusted during the process. If a material is being deposited on the workpiece, its properties such as the tension in a thin film, its composition, or internal structure could be varied during the plasma process. During an etching process, the properties of the ions could be tailored to optimize the etching process as the surface being etched changes. This has implications in the semiconductor industry where very deep and narrow trenches are cut using plasma processes. The uniformity and straightness of these trenches depends greatly upon the number and the properties of ions entering the trenches.

In another respect, if the at least two harmonics of the applied RF voltage that are even harmonics of each other are applied to the same electrode it is particularly advantageous. This has the advantage that an embodiment of the invention can be constructed by adding only a single electrode to the system. There exist many different embodiments of the invention for different types of plasma sources. Several of these will be detailed below in the Detailed Description.

In another respect, and embodiment of the invention will work if the applied RF voltage is applied to more than one electrode. It is important that the relative phases of voltage components that are an even multiple of each other are controlled. Splitting the applied RF voltage across several electrodes has the advantage that the method can be applied to more complex types of plasma operating apparatuses. The technique can also be applied when the relative phase of the harmonic components that are an even multiple of each other are fixed during a plasma treatment.

In another respect, constructing the applied RF voltage from the fundamental frequency of the applied RF voltage and its second harmonic has the advantage that, the ion energy varies as a linear function of the phase angle between the two. This clear and straight forward relationship between the ion energy and the phase angle allows the ion energy to be easily controlled and adjusted to a desired value during a manufacturing process. This relationship between the phase angle and the ion energy is demonstrated analytically and with a simulation in the Appendix. For the case shown in the Appendix, the amplitudes of the harmonic components were the same.

In another respect, embodiments of the invention can be geometrically symmetric, capacitively coupled radio-frequency plasmas. Capacitively coupled plasmas (CCP) typically have two or more electrodes exposed to a plasma. A geometrically symmetric CCP is when the CCP has two electrodes, and the surface area of the two electrodes are effectively the same. This is an extremely significant application of the method. In the semiconductor industry, the geometry based asymmetry effect is used to modify the ion energy of ions striking a substrate. If a large substrate is used, such as for a photovoltaic panel or a flat television screen, it is not possible to use the geometry based effect. The vacuum chamber would need to be prohibitively large. The method can be applied to manufacturing processes to which it is not possible using current methods. This is also an extremely novel application. It is not known in the art that a symmetric CCP can be made electrically asymmetric.

In another respect, the asymmetry of the sheaths between the plasma and the electrodes can be controlled by adjusting the relative phase of the harmonic components of the applied RF voltage. The total power absorbed into the plasma will affect the production of plasma, and hence the plasma density. The Root Mean Square (RMS) value of the applied RF voltage does not change as relative phases between its harmonic components change. This has the advantage that the power absorbed by the plasma remains nearly constant as the phase is adjusted. This allows the ion energy to be adjusted without large changes in the ion flux.

In another respect, embodiments of the invention can have an additional electrode added to a plasma operating apparatus that is independent of the excitation method of the plasma. When a plasma is generated using a particular type of plasma source, the plasma will have a particular density and there will be a particular ion flux with a particular ion energy received by a substrate exposed to the plasma for a given set of plasma operating conditions. Applying the method to different types of plasma sources has the advantage, that different combinations of ion flux and energy will be available for plasma processing. A variety of embodiments with different plasma sources are described below in the Detailed Description.

In another respect, embodiments of the invention can be constructed with an inductively coupled or microwave plasma source through an additional electrode. The addition of an additional electrode in these sources is very common, and is called an "RF Wafer Chuck." A DC bias is generated in front of the electrode using the geometrically based self bias effect and used to adjust the ion energy. Embodiments of the invention are also applicable to this case. The invention has the advantage that, the ion energy would be more adjustable. The electrical asymmetry would augment the geometrically based DC self bias effect.

In another aspect, embodiments of the invention relate to CCP. These discharges are generated and sustained by the RF voltage applied to the electrodes. Applying the method to plasmas generated by the same RF voltage that establishes the DC bias has the advantage that, the overall design of the plasma operating apparatus is simpler. It is also advantageous, because the invention can be applied to plasma operating apparatuses that are commonly used in industry.

In another aspect, the invention relates to the modification of surfaces exposed to plasmas. This is an advantage because, the flux and energy of ions striking a workpiece exposed to a plasma has a large effect on the structure and composition of the material. When an ion strikes the surface of a workpiece it imparts energy to the surface. For instance, this energy can cause chemical bonds to break or impart energy to atoms or molecules and allow a change in the physical structure of the surface. Controlling the ion energy and flux allows better control of surface modification during a plasma treatment.

In another aspect the invention relates to the etching of surfaces during plasma treatment. This is an advantage, because the ion flux and energy affects the uniformity and control of etching processes. Of particular interest is the etching of dielectric substrates or workpieces during the manufacture of semiconductor devices. These processes require uniformity over large areas, and precise control over the plasma to ensure that trenches cut during the etching process are uniform.

In another aspect the invention relates to the manufacture of semiconductor devices, Micro Electro Mechanical Systems (MEMS) devices, solar cell (photovoltaic) panels, and flat television screens. Embodiments of the invention have the advantage that the precise control of the DC offset and hence the control of the ion energy allows precise control of the manufacturing process for these products. Embodiments of the invention are particularly advantageous for the manufacture of photovoltaic panels and flat television screens. The large surface area of these products prevents the use of the methods currently known in the art. The large surface area of the substrate prevents the use of the geometrically based DC offset effect, because the vacuum chamber would need to be too large to be of practical use in manufacturing. Dual-frequency or Multi-frequency techniques would not be useable because the dimensions of the substrate are so large that the high frequency component of the applied voltage will have standing wave problems and the plasma will not be uniform.

In another aspect the invention relates to plasmas used for the sputtering of surfaces, gas phase surface modification, surface cleaning, the controlling of surface energies, improving biocompatibility, the promotion of adhesion, the manufacture of nanoparticles, the assembly of nanoparticles into structures, and/or the surface cross linking of structures. This has the advantage that new manufacturing processes can be developed. Combinations of ion energies and fluxes that were not previously possible can now be achieved. As was mentioned previously, the flux of ions and the energy of ions striking a surface exposed to a plasma affects the structure between atoms and molecules on the surface. If new combinations of ion energy and fluxes are available, new processes can be developed where the materials and surfaces have improved or new properties.

The present invention further provides that, a plasma operating system comprising a discharge of a capactively coupled radio-frequency plasma can be constructed wherein the ion flux and ion energy can be separately controlled as described in independent claim 28.

A further embodiment is described in dependent claim 29. This plasma operating system has the advantage that, it allows a greater control of the plasma processes performed in it in comparison with the current art. Again, it is understood that at least two electrodes are necessary to conduct electrical current through the plasma and that one electrode is the vacuum chamber wall and/or another surface such as part of a vacuum pump exposed to the plasma.

The present invention further provides for a method of independently controlling ion flux and ion energy in a plasma as described in independent claim 30. Further embodiments of the invention are described in dependent claims 31 through 39 and in dependent claim 43. The method modifies the ion energy by causing an asymmetry in the electric fields in the sheath of the electrodes as is described in the Appendix. To achieve this particular ion energy and ion flux, the power absorbed by the plasma is chosen. The power can be deposited into the plasma using a variety of different methods. A few examples would be a capacitive source, a microwave source, an inductive source, Neutral Loop Discharge (NLD), or a helicon discharge. The RF voltage that is applied to the plasma for adjusting the ion flux and/or ion energy also contributes to the total power absorbed by the plasma and needs to be considered also. The ion energy is then adjusted by adjusting the harmonic components of the applied RF voltage.

In another aspect, embodiments of the invention can be constructed by applying the RF voltage across two or more electrodes. This has the advantage that well defined electrodes define where the modification of the plasma sheath will occur, and also clearly define the path of the RF current induced by the application of the RF voltage. When the path of the RF current is not clearly defined the RF current can take different paths through plasma and through different parts of the apparatus. This can cause changes in the impedance of the plasma and instabilities during the plasma treatment.

In another respect, embodiments of the invention can use the workpiece as an electrode or can place the workpiece on a surface or directly adjacent to an electrode. This has the advantage that the workpiece receives the maximum benefit of adjusting the ion energy and/or ion flux. This is because the change in the ion flux and energy are adjusted the most in the sheath adjacent to an electrode or surface that functions as an electrode. When a workpiece is conductive and is in contact with an electrode then the workpiece functions as an electrode also. When a workpiece is made from a dielectric material, the workpiece should be placed in the sheath region of the electrode to receive the maximum benefit. Dielectric workpieces within the sheath region function as part of a capacitor. Flat substrates such as silicon wafers used for the manufacture of semiconductors are particularly easy to place within the sheath region of an electrode.

In another respect, embodiments of the invention can adjust the ion energy by adjusting the relative phase between the harmonic components of the applied RF voltage which are even harmonics of each other. The RMS value of the applied RF voltage is independent of the relative phase of its harmonic components. As a result, adjusting the relative phase will change the ion energy while the ion flux will see negligible changes.

In another aspect, the method of independently controlling the ion flux and ion energy can be modified by limiting the applied RF voltage to the case where the harmonic components are comprised of only the fundamental and its second harmonic. This has the advantage that the control of the ion energy is maximized and that the ion energy varies linearly as the phase between the fundamental and the second harmonic changes. The control of the ion energy depends upon the temporal asymmetry of the voltage applied to the electrodes. This effect is maximized by making the harmonics which have frequencies that are even multiples of each other as close in frequency as possible. This is of course optimized by choosing the fundamental and the second harmonic. Using just two harmonic components has the advantage that the RF circuitry would be less complicated. Including additional harmonics would add complexity and cost to the RF generating system. The Appendix contains details of the linear relationship between the ion energy and the phase angle for this case.

In another aspect, the method of independently controlling the ion flux and ion energy can be modified by using a lookup table to determine the phases and amplitudes of the harmonic components of the RF voltage necessary for a particular ion flux and ion energy. It can be expected the operator would use a combination of experiments and/or calculations to determine the optimum voltages. Examples of instruments or sensors that one could perform such experiments are discussed below. Examples of calculations are shown in the Appendix. This has the advantage, that the proper amplitudes, voltages, and phases of the RF voltage could be determined quickly.

In another aspect, the method of independently controlling the ion flux and ion energy can be modified by adjusting the ion flux and or ion energy based on measurements from sensors and/or instruments as described in dependent claim 37. An instrument is a measurement device which returns a calibrated measurement of some physical property. A sensor is the same as an instrument, except that the result is not calibrated. Examples of sensors or instruments that would provide useful measurements include: Langmuir probe, ion flux probe, Faraday cup, retarding field analyzer (for ion energies and fluxes), quadrupole mass spectrometer, and sensors that measure the harmonic components and/or phase of the RF voltage. This has the advantage that, changes in the plasma or the workpiece could be adjusted during a plasma treatment. For example, in the semiconductor industry it is very common to deposit thin films with a plasma. During the deposition process or over the course of many deposition processes materials can be deposited on the walls of the vacuum chamber. This can affect electrical properties in the vacuum chamber in which the plasma is generated. Adjusting the plasma process using sensor measurements would allow the chamber to be used for a longer time without having to clean the vacuum chamber and would prevent the change of the plasma treatment over time. This would reduce manufacturing cost.

In another respect, embodiments of the invention could allow for dynamic changes in the ion flux and the ion energy as described in dependent claim 38. A dynamic change is defined to mean a change which occurs in time. For example, if the ion energy changes dynamically, then the ion energy changes as a function of time during the plasma treatment. This is an advantage, because the ion flux and the ion energy can be used to deposit more complex materials on a substrate or optimize the etching of a substrate. When thin films are deposited by a plasma on a substrate, the layer is built up over time. If the ion flux and ion energy change during the deposition then the structure of the film can be adjusted. During the manufacture of semiconductor devices it is common to etch trenches with high aspect ratios. The profile of these trenches depends greatly upon the number of ions penetrating into the trench. Adjusting the ion energy and flux could be used to optimize the process during the different stages of when the trench is cut.

In another respect, embodiments of the invention could include a computer program product for performing the method described in any one of claims 30 to 38. This has the advantage that complex models and lookup tables could be used for choosing and optimizing the ion flux and ion energy during a plasma treatment. It may require too much time for a human operator to properly calculate the values to use to control the plasma apparatus.

The present invention further provides for a controller for controlling a plasma apparatus as described in independent claim 40. This has the advantage that the ion flux and the ion energy can be controlled as independent parameters. In the current art, an operator sets the power to be deposited into a plasma. Embodiments of the controller could allow an operator to choose the ion flux and energy directly.

The present invention further provides for a method of causing an asymmetry in the sheath adjacent to two or more electrodes exposed to a plasma as is described in independent claim 41. Further embodiments of the invention are described in dependent claims 42 and 43. This has the advantage that the properties of the sheaths in front of the different electrodes have different physical properties and this allows for the modification and adjustment of plasma treatments. This asymmetry is described in the Appendix. The control of the ion energy and the control of the DC bias in front of an electrode are manifestations of this asymmetry. The method not only causes an electric asymmetry in the sheaths, but also a physical asymmetry. The plasma sheath region in front of an electrode depends upon the strength of the electric field across the sheath. As a DC bias increases, the sheath region will grow larger.

BRIEF DESCRIPTION OF THE DRAWINGS

In the following preferred embodiments of the invention are described in greater detail by way of example only making reference to the drawings in which.

DETAILED DESCRIPTION

Figure 1:
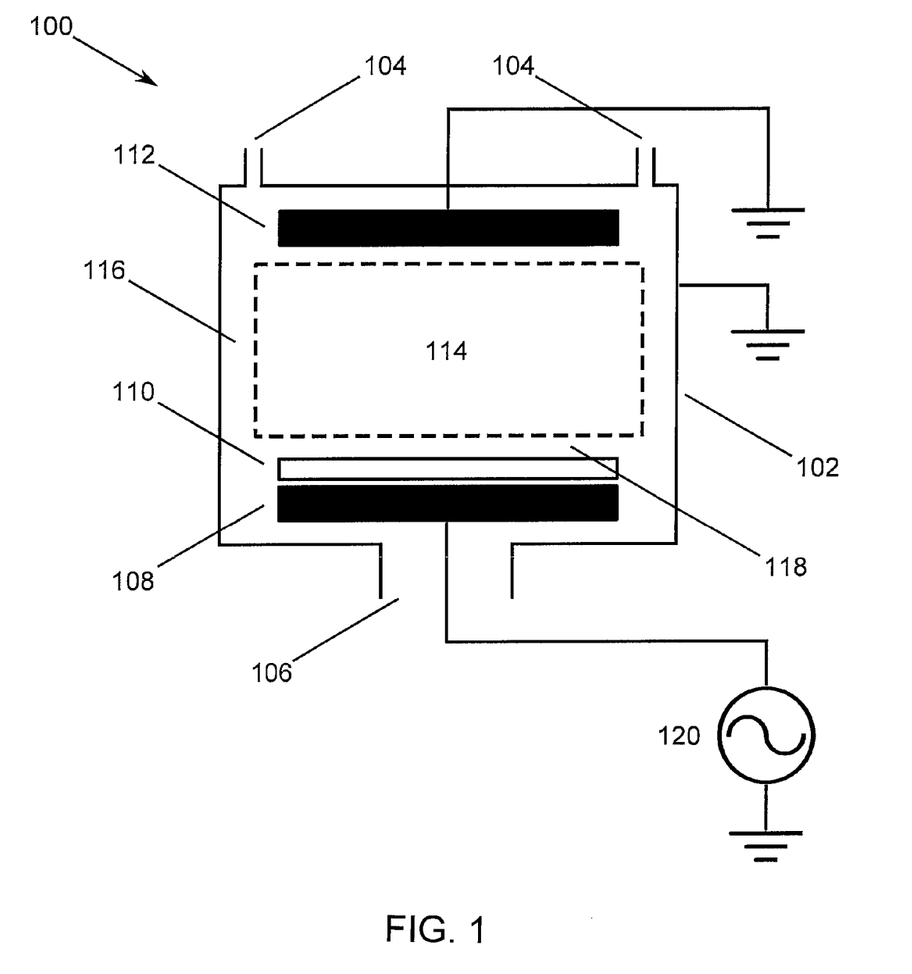
FIG. 1 is a schematic of a plasma operating apparatus that incorporates an embodiment of the invention.

FIG. 1 shows a cross-sectional view of an idealized plasma operating apparatus with a capacity coupled plasma source. Other figures that show embodiments of plasma operating apparatuses are displayed in the same way. Embodiments of the invention using a variety of plasma sources will be detailed below to demonstrate the wide applicability of the invention. Components in these figures are denoted with a three digit number. Components which are identical use the same number through-out all of the figures. If components are similar or have the same function, then the last two digits are identical.

The plasma operating apparatus shown in FIG. 1 comprises a vacuum chamber wall 102, a gas inlet 104, a vacuum outlet 106, a powered electrode 108, a grounded electrode 112, and an RF voltage system 120. A plasma 114 is generated in the volume of the chamber in between the powered electrode 108 and the grounded electrode 112. This is a schematic embodiment of the invention. The invention works by applying an RF voltage using RF voltage system 120 to the powered electrode 108, where the voltage applied to the powered electrode 108 consists of two RF voltages which are even harmonics of each other and the phase relationship between the two is controlled. In this example the substrate 110 is shown as being placed directly in front of the powered electrode 108, however the substrate could also be placed in front of the grounded electrode 112. The specific embodiment of the invention is also not dependent upon the RF voltage system 120, it is only necessary that the RF voltage applied to the powered electrode 108 has at least two harmonic components which have a controlled relative phase.

In between the plasma 114 and any surface exposed to the plasma a boundary layer or a plasma sheath develops between the two. The plasma 114 is very conductive and the voltage drop across the plasma 114 is very small. The majority of the voltage drop is across the sheath regions 116. In order to expose a substrate to plasma processing a substrate 110 is inserted into the plasma in front of the powered electrode 108 between the powered electrode 108 and the plasma 114. The electric field in front of the powered electrode in the sheath region 118 accelerates ions towards the substrate 110. The effect of the electric field in the sheath region on ions is discussed in the Appendix. The invention modifies the electric field in front of both the powered electrode 108 and the grounded electrode 112.

Figure 2:
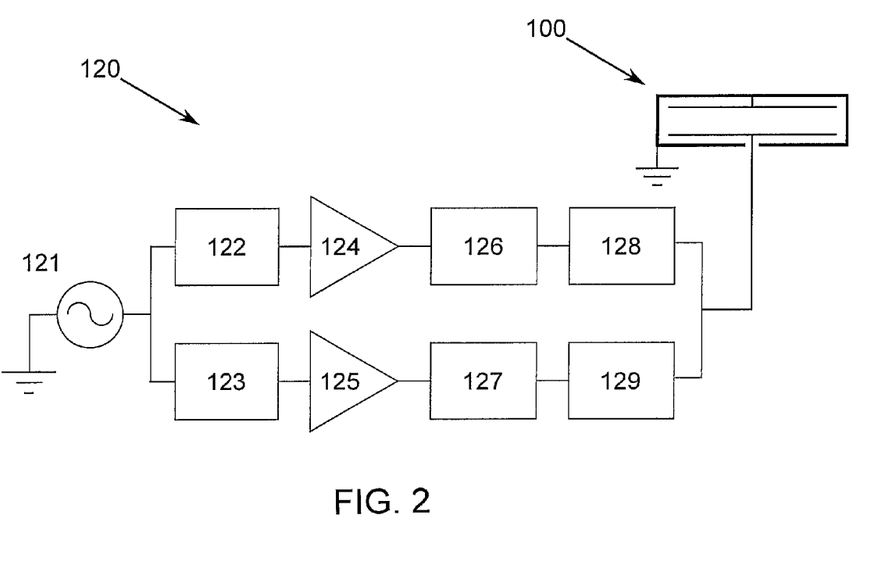
FIG. 2 is a schematic of an RF voltage system that is part of an embodiment of the invention.

FIG. 2 shows an embodiment of an RF voltage system used for the invention and its relationship to a capacity coupled plasma operating apparatus 100. The RF voltage system is comprised of an RF voltage generator 121, a phase shifter 122, a frequency doubler 123, an RF amplifier 124, an RF amplifier 125, a low pass filter 128, and a high pass filter 129. This embodiment of an RF voltage system produces an RF voltage which is comprised of a fundamental and its second harmonic. The RF voltage generator is connected to the input of both the phase shifter 122 and the frequency doubler 123. The purpose of a phase shifter is to control the relative phase of the two harmonic components. The purpose of the frequency doubler is to produce the second harmonic. The output of the phase shifter is connected to the input of RF amplifier 124 and the output of frequency doubler 123 is connected to the input of RF amplifier 125. The output of RF amplifier 124 is connected to the input of impedance matching network 126 and the output of impedance matching network 126 is into the input of the low pass filter 128. The purpose of the low pass filter is to prevent RF power from the second harmonic from entering the matching network of the fundamental. The output of RF amplifier 125 is connected to the input of impedance matching network 127. The output of the impedance matching network 127 is into the input of the high pass filter 129. The purpose of the high pass filter is to prevent RF energy from the fundamental from entering the matching network of the second harmonic. The output of the low pass filter 128 and the output of the high pass filter 129 are connected to the powered electrode 108 of the capacitively coupled plasma operating apparatus 100.

This embodiment could be redesigned in several different ways. The phase shifter 122 could be used for either the fundamental or the second harmonic. If the matching networks and filters were changed, the frequency doubler could also be replaced by a frequency divider. It would be also possible to add RF voltages for other harmonics by adding more phase shifters and including more frequency multipliers or dividers. It would also be possible to envisage a system where only a single matching network is used. The RF voltage generator could be replaced by a generator that produces an arbitrary waveform. This waveform would then pass through a single broad band RF amplifier and then through a single impedance matching network. Most likely the impedance matching network would need to have a very low Q for this to work. The transfer of energy to the plasma would not be efficient, but it would be possible.

Figure 3:
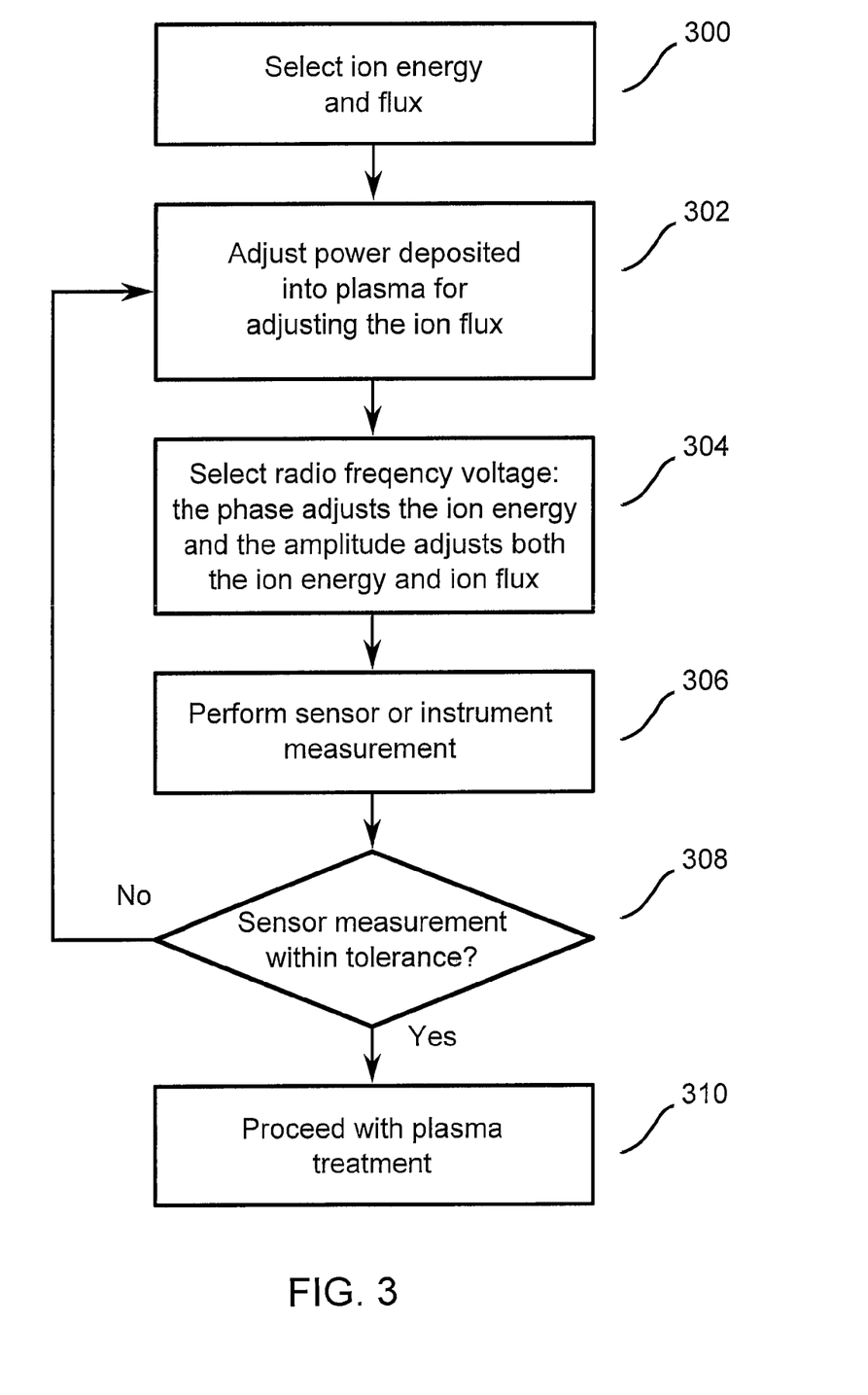
FIG. 3 is a flow diagram of an embodiment of a method of performing the invention.

FIG. 3 shows a flow diagram of an embodiment of a method for performing the invention. The first step would be to select the ion energy and flux 300. The next step would be to adjust the total power absorbed by the plasma 302. The way that the power is absorbed by the plasma depends upon the mechanism for generating the plasma. Also, the RF power applied to the electrodes contributes to the power absorbed by the plasma. This additional power contributed by the electrodes should be taken into account when determining the ion flux. In general terms, the power absorbed into the plasma determines the ion flux. A radio frequency voltage is then selected which is used to adjust the ion energy 304. Changing the phase or the relative phase between two even harmonics changes the ion energy. Changing the amplitude of a harmonic component changes both the ion energy and the ion flux. In some situations the power and the radio frequency voltage would remain fixed during a plasma process. However, in some situations the plasma or the conditions necessary for the plasma treatment will change over time. In this case, a sensor could be used to measure some property of the plasma and be used to adjust the ion flux and ion energy dynamically. In this case the next step would be to perform a sensor or instrument measurement 306. Then either an operator or a controller would determine if the sensor measurement was within a specified tolerance 308. If the measurement is within tolerance then one would proceed with the plasma treatment 310. If not, then there would be a loop going back to adjusting the power 302 that is absorbed by the plasma and the same loop would repeat itself until the sensor was within tolerance. Then the plasma treatment would then proceed 310.

Figure 4:
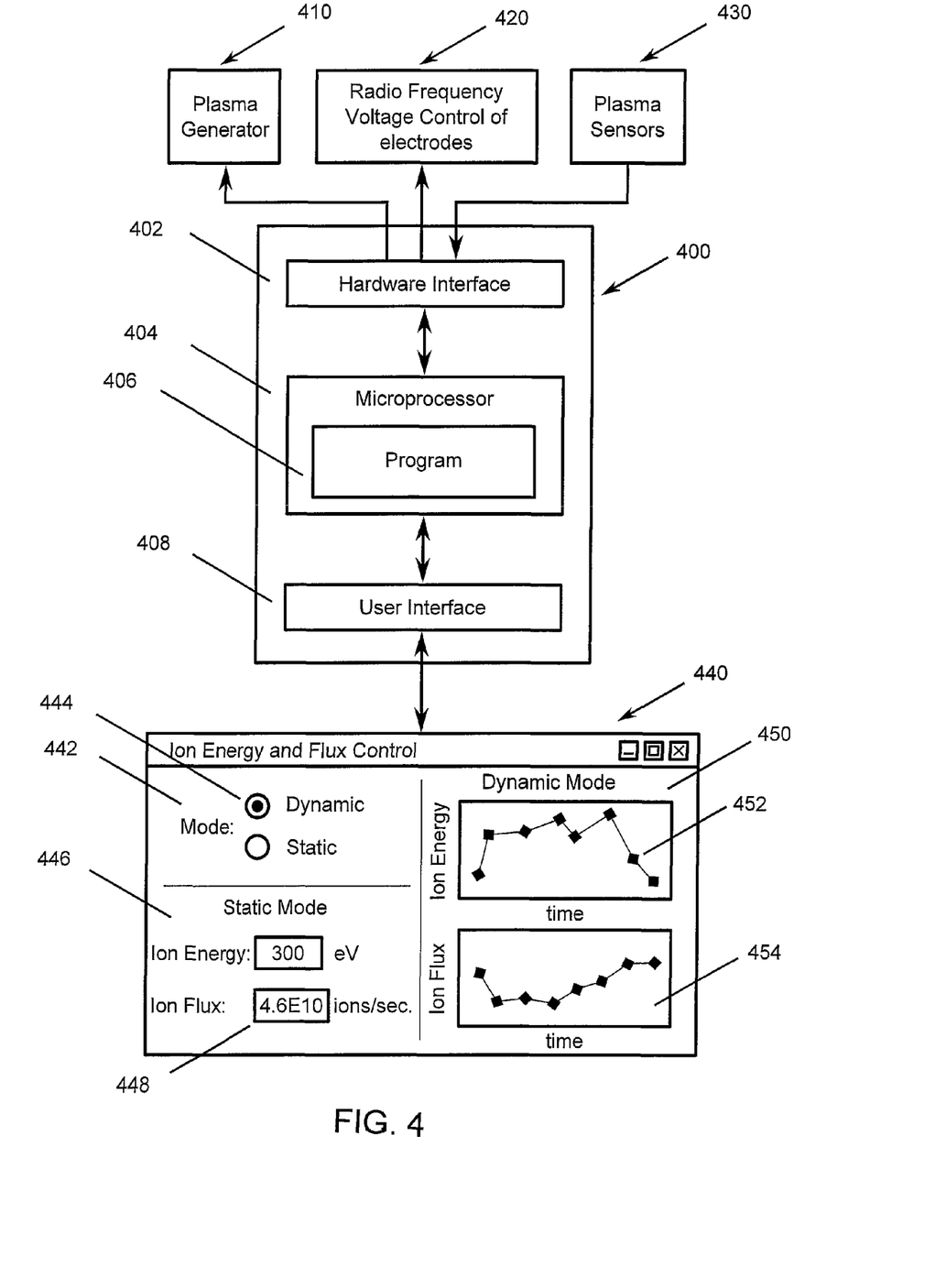
FIG. 4 is a schematic of an embodiment of a controller for automating an embodiment of the method of the invention.

FIG. 4 is a schematic of an embodiment of a controller for automating the method of the invention. This figure shows the controller 400, a plasma generator 410, a radio frequency control for the voltage applied to the electrodes 420, values returning from the plasma sensor 430, and a dialogue box showing the ion energy and flux control 440. The control system 400 is comprised of a hardware interface 402, a microprocessor 404, a computer program product 406, which is executed by the microprocessor 404 and a user interface 408. An embodiment of the microprocessor could be a computer system.

The microprocessor 404 is connected to the hardware interface 402. The hardware interface 402 is connected to the plasma generator 410 and is able to control the amount of power absorbed by the plasma. The hardware interface is also connected to the radio frequency voltage control of the electrodes 420, and is used for controlling the voltage that is applied to the electrodes. The output of the plasma sensors 430 is also connected to the hardware interface 402. This data is used by the microprocessor 404 for adjusting the ion flux and energy. The microprocessor 404 is also connected to the user interface 408.

The user interface 408 is so that a user can control the ion energy and/or ion flux. Dialogue box 408 is a possible embodiment of a user interface. In this embodiment the system is able to be operated in two modes: either in dynamic mode or in static mode. In the static mode the ion energy and ion flux are set throughout the entire plasma treatment period. In the dynamic mode either or both the ion energy and the ion flux are able to have their values changed as a function of time. The dialogue box is divided into three regions. The first region is a region for selecting the operational mode 442. The second region is a region for controlling the ion energy and ion flux in the static mode of operation 446 and the third region is a region for dynamically controlling the ion energy and ion flux.

In the region for selecting the operational mode are two radio buttons 444. With these the user is able to select either the dynamic or the static mode. In the region for controlling the ion energy and ion flux in static mode 446 there are two text input boxes 448. Here the user is able to enter the ion flux and the ion energy. In the region for dynamically controlling the ion energy and ion flux 450, there are two input fields 454. These input fields 454 are used for setting either the ion energy or the ion flux as a function of time. This is accomplished by the user clicking and dragging the user adjustable controller 452. Normally when one operates a plasma operating apparatus the user would set values such as the power absorbed by the plasma or the power applied to the electrodes. This has the disadvantage that these parameters are not directly related to the resulting effect of the plasma treatment on the workpiece. An advantage of this system is that the user is able to directly control the ion energy and ion flux which is directly related to the effect of the plasma treatment on a workpiece.

Figure 5:
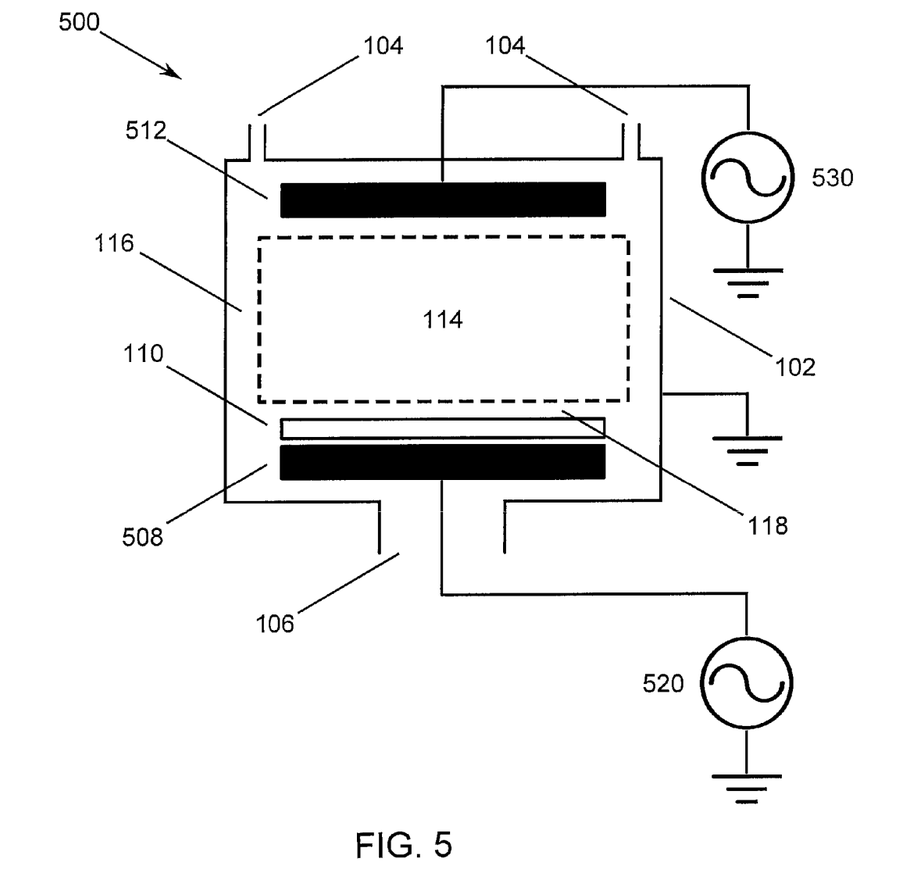
FIGS. 5-9 are schematics of plasma operating apparatuses that incorporate embodiments of the invention.

FIG. 5 shows a plasma operating apparatus with two capacitively coupled plasma sources 500. This is very similar to the plasma apparatus shown in FIG. 1. The difference is that the grounded electrode is now connected to its own RF voltage system 530. This is called the second RF voltage system 530 and the essential difference is that an additional powered electrode has been added to the system. The RF voltage system 520 is connected to the powered electrode 508, a substrate or work piece is placed in front of the powered electrode 508. The substrate can also be placed in front of the second powered electrode 512. The second powered electrode is connected to the second RF voltage system 530. The embodiments of the RF voltage system 520 and the second RF voltage system 530 could be constructed in many different ways. The essential element is that at least two harmonic components of the applied RF voltage be even harmonics of each other and that there is a controlled relative phase between the two. This could be accomplished by having both of these harmonic components on RF voltage generator 520 or the second RF voltage 530. It is possible that RF voltage system 520 is operated in a mode where there is no phase locking with the second RF voltage system 530, or they could be operated in a phase locked manner.

Figure 6:
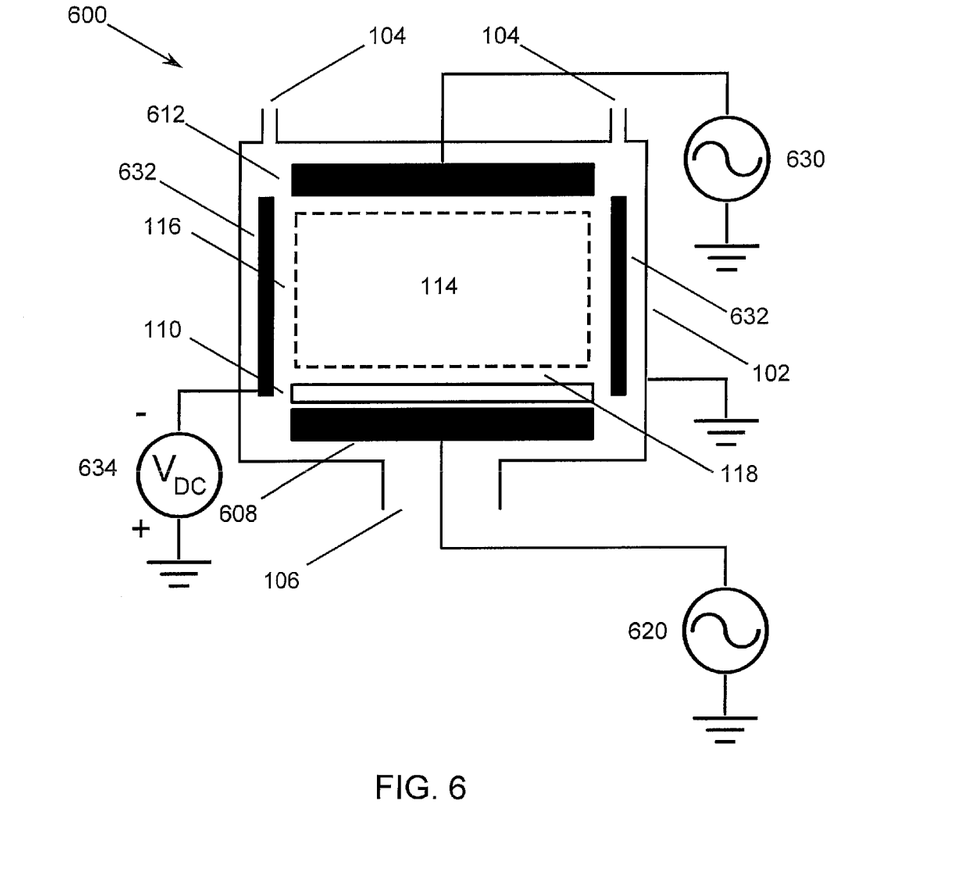

FIG. 6 shows a plasma operating apparatus with a DC/RF triode source 600. This is very similar to the capacitively coupled plasma source shown in FIG. 5, except the addition of an additional DC electrode 632. This electrode 632 is connected to a DC power source 634. In this figure the RF voltage system 620 is connected to the powered electrode 608 and the second RF generator 630 is connected to the second powered electrode 612. Again, the substrate 110 is shown as being placed on the powered electrode 608. The substrate could also be placed upon the second powered electrode 612 or even the electrode 632 connected to the DC power source 634. Again, the RF voltage system 620 and the second RF voltage system 630 could have a variety of different embodiments. The two phase controlled even harmonics of the applied voltage could be applied entirely through RF voltage system 620 or through RF voltage system 630 or the two RF voltage systems could be operated in a phase locked manner.

Figure 7:
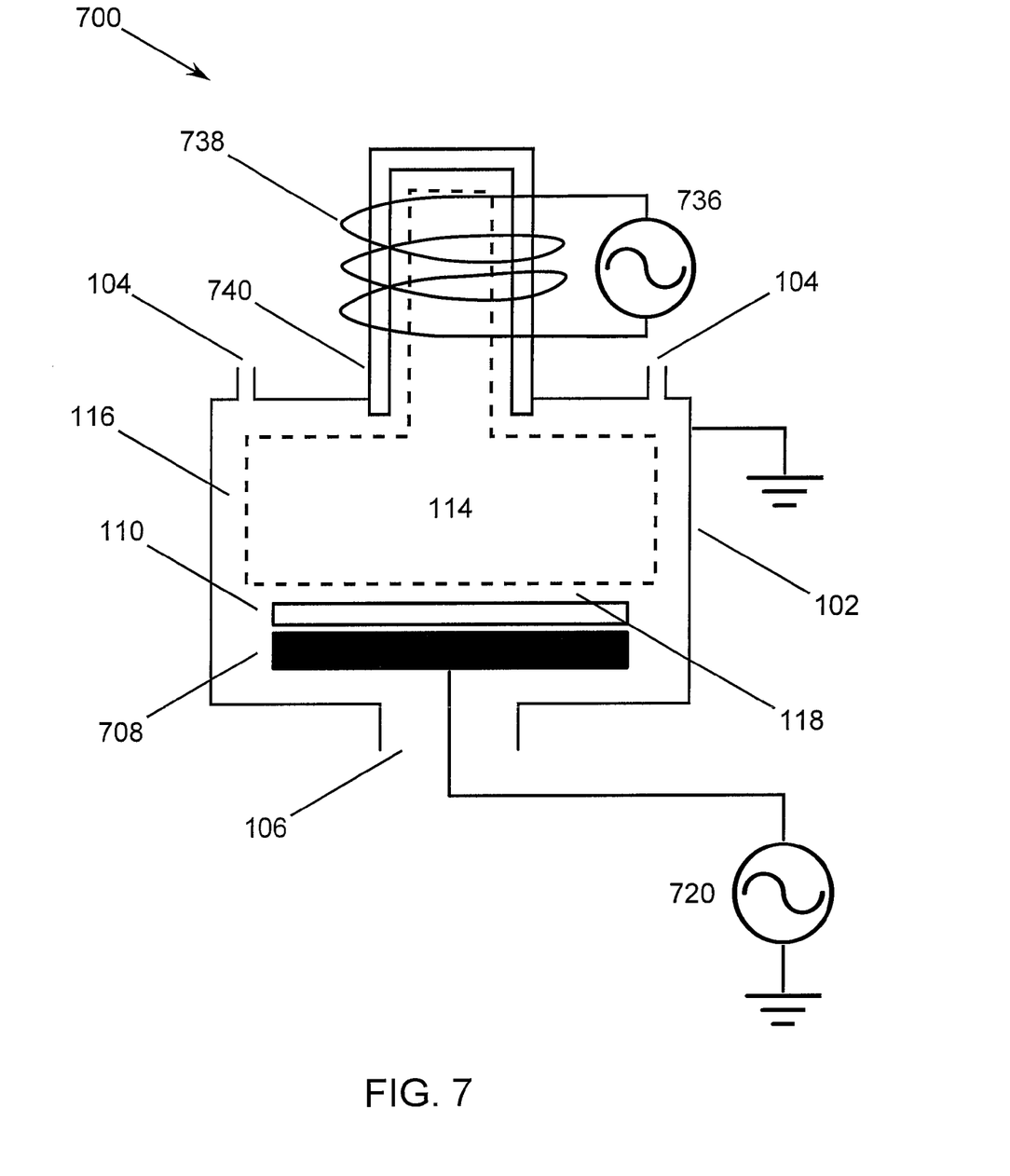

FIG. 7 shows a plasma operating apparatus with an inductively coupled plasma source 700. The basic structure of the plasma chamber is identical to previous embodiments, however the method of coupling power into the plasma and the primary method of generating the plasma is different. In this embodiment an RF generator 720 is connected to the powered electrode 708. The substrate is placed on the powered electrode 708 and the vacuum chamber wall 102 functions as the second electrode. The RF current takes a path from the powered electrode 708 to the vacuum chamber wall 102. The second RF voltage system 736 is connected to a coil 738 which is shown as being wrapped around a dielectric tube 740 which is sealed at one end and has the other end open to the vacuum chamber 102. The RF power is coupled inductively to the plasma 114. For the inductively coupled source to function it is only necessary that a changing magnetic field is coupled to the plasma 114. The dielectric tube 740 could be replaced with a dome or a flat surface. The wafer or substrate could also be placed in the vicinity of the plasma chamber wall 102 to receive the benefit of the invention. The purpose of this figure is to show how the invention could be implemented in a radically different type of plasma operating apparatus. The advantage of using different types of plasma sources is that you would have different combinations of ion fluxes and ion energies available. In this example the embodiment of the RF voltage system 720 could be nearly identical to the RF voltage system 120 shown in FIG. 1. It would also be possible to add additional electrodes to this system.

Figure 8:
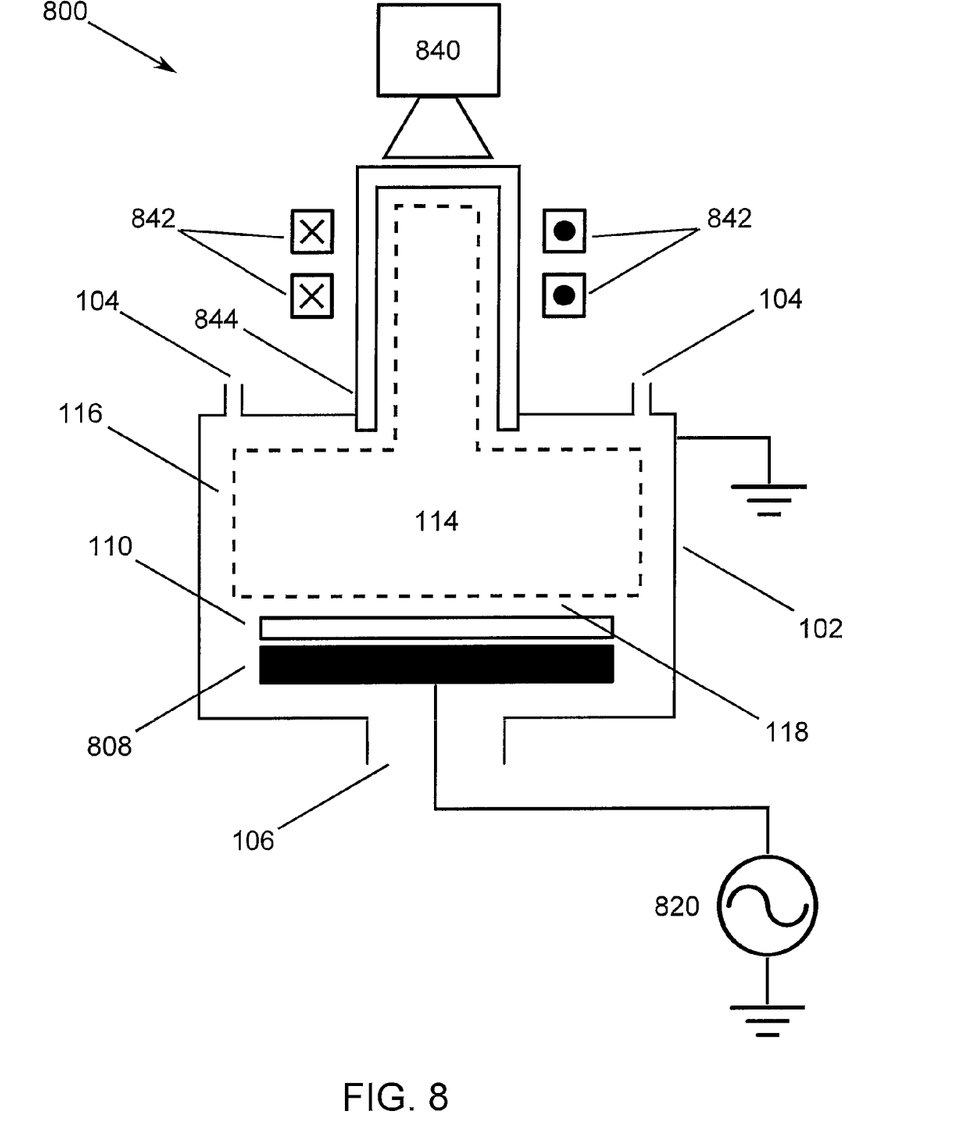

FIG. 8 shows an embodiment of the invention included in a plasma operating apparatus with an ECR (Electron Cyclotron Resonance) plasma source 800. The basic structure of the vacuum chamber is very similar to the previous embodiments except that the main method of generating the plasma is different. The RF voltage system 820 is connected to the powered electrode 808. The embodiment of RF voltage system 820 would be very similar to an embodiment of the RF voltage system 120 shown in FIG. 1. The plasma is generated by directing a microwave source 840 towards a dielectric tube 844. A magnetic field is formed by coils 842 which are wound around the dielectric tube 844. Again, the dielectric tube is closed at one end and opens into the volume of the vacuum chamber. The plasma is generated inside the dielectric tube 844 and streams into the plasma chamber. Again the substrate could be placed adjacent to the vacuum chamber wall 102 instead of being placed upon the powered electrode 108.

Figure 9:
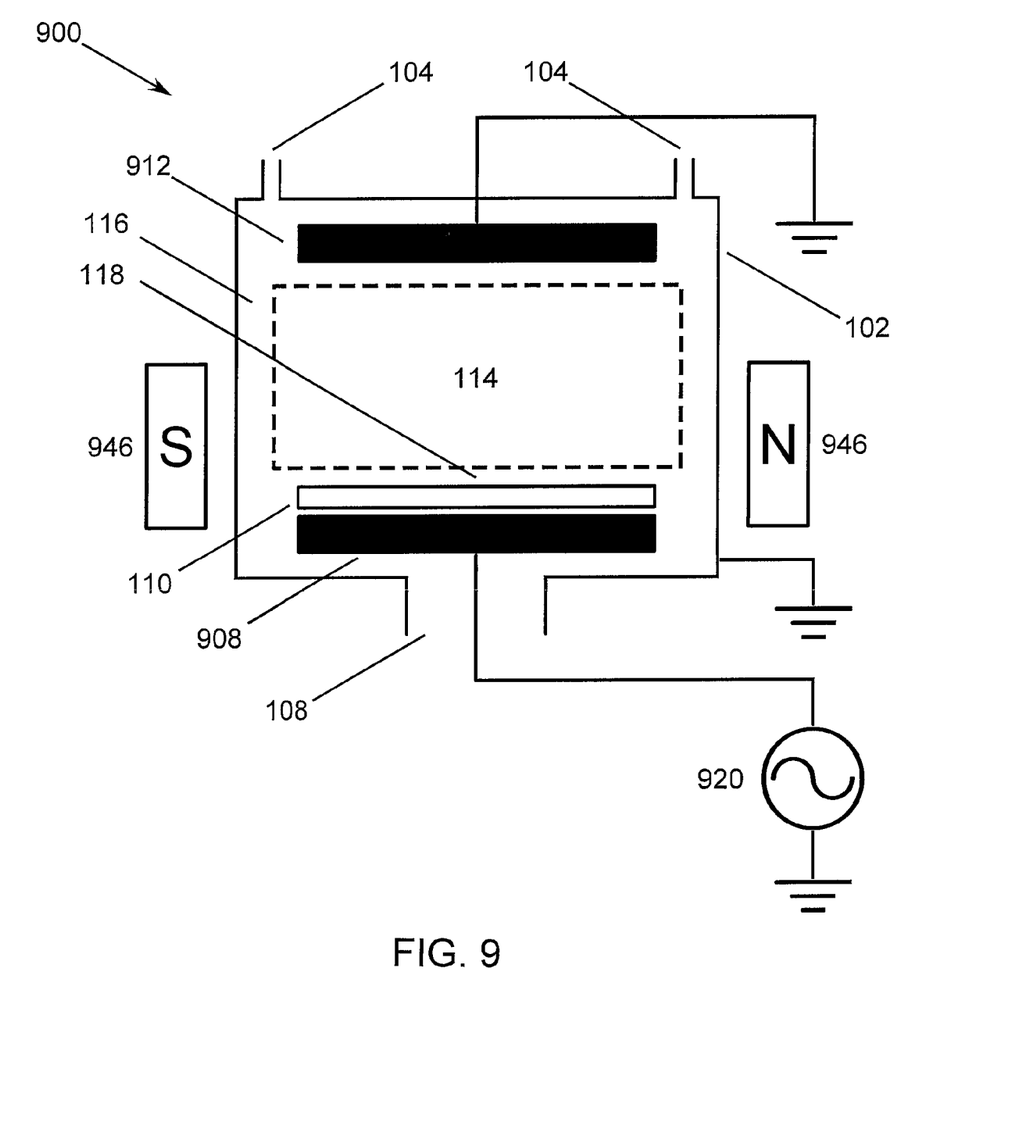

FIG. 9 shows an embodiment of the invention in a plasma operating apparatus with a magnetically enhanced capacitively coupled plasma source 900. This embodiment of the invention is almost identical to that shown in FIG. 1. The difference is that several magnets have been placed in proximity outside of the vacuum chamber wall to the powered electrode 908. The purpose of these magnets is that is slows the diffusion of electrons towards the electrode and enhances the plasma density within the vacuum chamber. The RF voltage system 920 is connected to the powered electrode 908. The substrate is placed upon the powered electrode 908. Again, the substrate or work piece could also be located in front of the grounded electrode 912. The ground electrode is connected to the ground. The magnets 946 are located outside the chamber wall 102 adjacent to the powered electrode 908. This is another example of how the invention could be applied to a conventional plasma operating apparatus. The RF generator 920 would have an embodiment very similar or the same as the embodiment shown in FIG. 1.

The embodiments of the invention shown in FIG. 1 and in FIGS. 5 through 9 demonstrate the wide applicability of the invention. Embodiments of the invention can be implemented in other types of discharges that are not described. In particular, the invention can also be applied to NLD and helicon discharges.

List of reference numerals

| | |
|---|---|
| 100 | Plasma operating apparatus with a capacitively coupled plasma source |
| 102 | Vacuum chamber wall |
| 104 | Gas inlet |
| 106 | Vacuum pump outlet |
| 108 | Powered electrode |
| 110 | Substrate or work object |
| 112 | Grounded electrode |
| 114 | Plasma |
| 116 | Plasma sheath |
| 118 | Plasma sheath above the substrate |
| 120 | RF voltage system |
| 121 | RF voltage generator |
| 122 | Phase shifter |
| 123 | Frequency doubler |
| 124 | RF amplifier |
| 125 | RF amplifier |
| 126 | Impedance matching network |
| 127 | Impedance matching network |
| 128 | Low pass filter |
| 129 | High pass filter |
| 400 | Control system |
| 402 | Hardware interface |
| 404 | Microprocessor |
| 406 | Computer program product |
| 408 | User interface |
| 410 | Plasma generating system |
| 420 | Control unit of RF voltage system |
| 430 | Plasma sensor |
| 440 | Dialogue box for ion energy and ion flux control |
| 442 | Region for selecting operation mode |
| 444 | Radio buttons |
| 446 | Region for controlling ion energy and ion flux in static mode |
| 448 | Text input boxes |
| 450 | Region for dynamically controlling the ion energy and ion flux |
| 452 | User adjustable controller |
| 454 | Input field |
| 500 | Plasma operating apparatus with two capacitively coupled plasma sources |
| 508 | Powered electrode |
| 512 | Second powered electrode |
| 520 | RF voltage system |
| 530 | Second RF voltage system |
| 600 | Plasma operating apparatus with a DC/RF triode source |
| 608 | Powered electrode |
| 612 | Second powered electrode |
| 620 | RF voltage system |
| 630 | Second RF voltage system |
| 632 | Electrode |
| 634 | DC voltage source |
| 700 | Plasma operating apparatus with an inductively coupled plasma source |
| 708 | Powered electrode |
| 720 | RF voltage system |
| 736 | Second RF voltage system |
| 738 | Coil |
| 740 | Dielectric tube |
| 800 | Plasma operating apparatus with an ECR plasma source |
| 808 | Powered electrode |
| 820 | RF voltage system |
| 840 | Microwave source |
| 842 | Coils to generate magnetic field |

-continued

| | List of reference numerals |
|---|---|
| 844 | Dielectric tube |
| 900 | Plasma operating apparatus with a ME capacitively coupled plasma source |
| 908 | Powered electrode |
| 912 | Grounded electrode |
| 920 | RF voltage system |
| 946 | Magnet |

What is claimed is:

1. A method of establishing a DC bias in front of at least one electrode in a plasma operating apparatus by applying to one electrode an RF voltage with at least two harmonic frequency components with a controlled relative phase between the components, where at least one of the higher frequency components is established as an even multiple of the lower frequency component.

2. A method of establishing a DC bias in front of at least one electrode in a plasma operating apparatus by applying an RF voltage with at least two harmonic frequency components with a controlled relative phase between the components, where at least one of the higher frequency components is established as an even multiple of the lower frequency component and the DC bias of sheaths between the plasma and the electrodes is linearly adjusted by tuning the relative phase.

* * * * *